(12) United States Patent
Song

(10) Patent No.: US 12,136,467 B2
(45) Date of Patent: Nov. 5, 2024

(54) TRACKING THE EFFECTS OF VOLTAGE AND TEMPERATURE ON A MEMORY DEVICE USING AN INTERNAL OSCILLATOR

(71) Applicant: Micron Technology, Inc., Boise, ID (US)

(72) Inventor: Keun soo Song, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 17/831,114

(22) Filed: Jun. 2, 2022

(65) Prior Publication Data
US 2023/0395098 A1    Dec. 7, 2023

(51) Int. Cl.
*G11C 7/04*        (2006.01)
*G11C 7/10*        (2006.01)
*H03K 19/21*       (2006.01)
*H03L 7/099*       (2006.01)

(52) U.S. Cl.
CPC .............. *G11C 7/04* (2013.01); *G11C 7/1069* (2013.01); *G11C 7/1096* (2013.01); *H03K 19/21* (2013.01); *H03L 7/0995* (2013.01)

(58) Field of Classification Search
CPC ....... G11C 7/04; G11C 7/1069; G11C 7/1096; H03K 19/21; H03L 7/0995
USPC .......................................................... 365/211
See application file for complete search history.

(56) References Cited

U.S. PATENT DOCUMENTS

2022/0075564 A1*   3/2022   Moon ................... G11C 7/222

* cited by examiner

*Primary Examiner* — Huan Hoang
(74) *Attorney, Agent, or Firm* — Lowenstein Sander LLP

(57) ABSTRACT

A first oscillator counter value is received at a first time, and a second oscillator counter value is received at a second time. The first time precedes the second time. The first oscillator count value is compared to the second oscillator count value. responsive to determining that the first oscillator count value and the oscillator second count value do not match, a propagation delay for performing write operations on a memory device is adjusted.

17 Claims, 6 Drawing Sheets

500

Identify a first oscillator count value representing a first output of a ring oscillator at a first time, and a second oscillator count value representing a second output of the ring oscillator at a second time, wherein the first time precedes the second time.
510

Compare the first oscillator count value and the second oscillator count value.
520

Perform a write operation on a memory device, wherein a timing of the write operation is adjusted based on a difference between the first oscillator count value and the second oscillator count value.
530

FIG. 5

TRACKING THE EFFECTS OF VOLTAGE AND TEMPERATURE ON A MEMORY DEVICE USING AN INTERNAL OSCILLATOR

TECHNICAL FIELD

Embodiments of the disclosure relate generally to memory sub-systems, and more specifically, relate to tracking the effects of voltage and temperature on a memory device using an internal oscillator.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 is a flow diagram of an example method to adjust the timing of a write operation based on a difference between oscillator count values, in accordance with some embodiments of the present disclosure.

DETAILED DESCRIPTION

Figure 1:
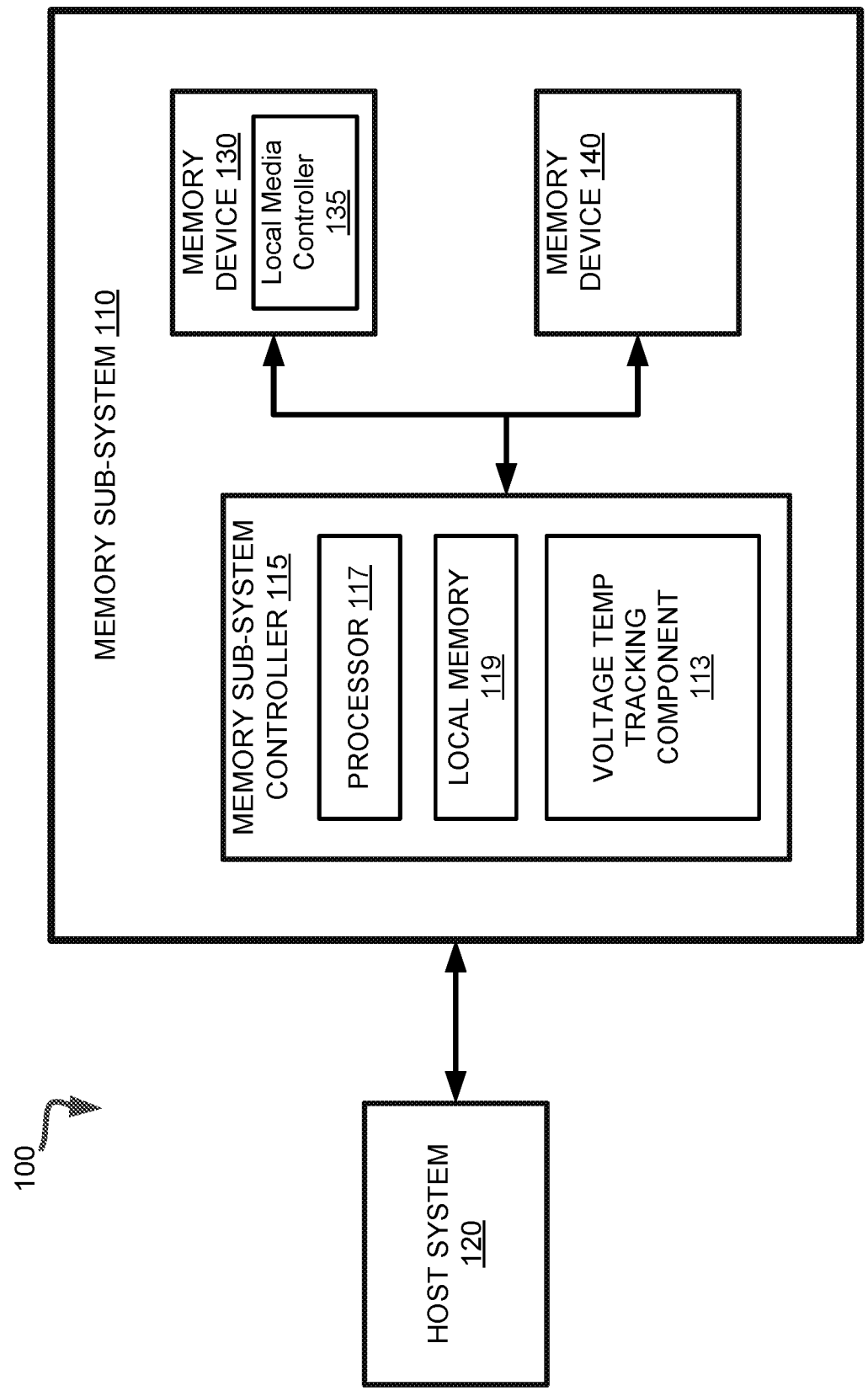
FIG. 1 illustrates an example computing system that includes a memory sub-system in accordance with some embodiments of the present disclosure.

Aspects of the present disclosure are directed to tracking the effects of voltage and temperature on a memory device using an internal oscillator. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory sub-system can include an internal clock component that manages the timing of various operations, such as write operations, read operations, refresh operations, etc. To properly execute such operations, a memory device can include a replica of the memory sub-system's clock circuitry. When the memory sub-system is powered on, the memory sub-system controller performs a series of steps to initialize and calibrate the memory device's replica clock circuitry. The steps can include command address training, during which the memory sub-system controller aligns the clock signal with the command address signal; write leveling, during which the memory sub-system controller determines the relationship between the memory sub-system's internal clock and the memory device's replica clock circuitry, providing a sufficient margin to cover any drift that many occur during system operation; read training, during which the memory sub-system controller determines an offset to apply to the memory device's replica clock circuitry to accurately read data output from the memory device; and write training, during with the memory sub-system controller determines an offset to apply to the memory device's replica clock circuitry to accurately write data to the memory device. In embodiments, read training and write training align the data bus to the memory device's replica clock circuitry.

Hence, to ensure proper timing parameters for the various operations, a memory sub-system controller can perform read and write training at initializing of the memory sub-system. Write training ensures that data is reliably written to a memory device. Since a memory device can experience a delay between when a signal is sent and when it is received by the memory device at the desired location, the write training procedure includes determining the appropriate write latency delay between the internal write command and the availability of the first bit of input data. The write latency delay can be an offset, for example, a set number of clock cycles. The memory sub-system controller can determine the offset, and can set the corresponding timing parameters to the appropriate value to ensure data is reliably written to the memory device. The memory device can apply the offset to its replica clock circuitry to implement the write operation's timing parameters.

During operation of the memory sub-system, changes to supply voltage or temperature can gradually shift the write and read positions away from the offset positions determined during read and write training. Thus, in some memory sub-systems, the memory sub-system controller can repeat the write training and read training procedures at regular intervals. In some memory sub-systems, a memory device's internal clock replica can provide input to an oscillator. The memory sub-system controller can use the oscillator to monitor changes in the memory device's internal clock delays caused by shifts in voltage and/or temperature. The oscillator can be a ring oscillator capable of detecting variations in process, voltage, and/or temperature (PVT) of the memory device. The change in PVT can be reflected as a change in oscillation frequency, and an oscillator counter can indicate whether the delay has increased or decreased. Some memory sub-system controllers use the oscillator frequency and counter values to adjust the write latency offsets, and to determine when to repeat the write and/or read training procedures. However, performing multiple write and read training procedures during operation of the memory sub-system can negatively impact the memory sub-system's performance. That is, write and read training procedures consume time and resources that could otherwise be used to perform the various operations on the memory device.

In order to avoid performing multiple write training procedures, some memory sub-system controllers can apply an offset to the timing delay signals based on a measured temperature and/or supply voltage changes. However, because such offsets are based on the measured temperature and/or supply voltages changes rather than based on the changes to the internal clock, the offsets applied may not accurately reflect accurate timing changes for the various operations.

Aspects of the present disclosure address the above and other deficiencies by providing a memory sub-system that accurately tracks the temperature and/or supply voltage changes impacting a memory device using an oscillator's outputs. The memory device can include an internal oscillator that receives an input signal from a replica of the memory sub-system's internal clock. The memory device can include an oscillator timer, and the memory sub-system controller can determine the run-time for the oscillator timer. The oscillator can include a number of counters, which can output a value at the expiration of the oscillator timer. The memory sub-system controller can then compare the oscillator counter value from one run-time to the next to determine whether the memory device has been affected by varying temperatures and/or supply voltages during operation. The memory sub-system controller can then adjust the writing delay offset using the oscillator output value.

In embodiments, the oscillator can include one or more counters, and each counter can output a value after each run cycle. A run cycle represents a given time interval during which the oscillator is running. For example, the memory sub-system controller can issue a command to start the oscillator, and a command to stop the oscillator. The time interval between the start and stop commands represents a run cycle. At the end of the run cycle, each counter can output a count value. In embodiments, the oscillator has a defined run time, and, after receiving the start command, can automatically stop at the expiration of the defined run time. In some embodiments, the oscillator can run continuously, according to a predefined run time. The memory device can store the counter output in a mode register, and the memory sub-system controller can access the mode register to identify the counter output values. The memory sub-system controller can then compare the output values from one run cycle to the next. The comparison can be an exclusive OR (XOR) operation. If the result of the XOR operation is false, the memory sub-system controller can determine that the memory device has not experienced adverse impacts from the varying operating conditions. Conversely, if the result of the XOR operation is true, the memory sub-system controller can determine that the output values from the previous cycle do not match the output values from the current cycle, thus indicating that the memory device has been affected by the varying operating conditions.

If the memory device has been affected by varying operating conditions, the memory sub-system controller can adjust the timing parameters for the various operations performed by the memory device. To accurately adjust the timing parameters, the memory sub-system controller can subtract the current oscillator counter output values from the previous oscillator counter output values to determine whether to add or subtract a delay from the timing parameters. That is, if the oscillator output values indicate that the values are shifting toward an increased delay, the memory sub-system controller can adjust the timing parameters by adding a delay factor. Conversely, if the oscillator output values indicate that the values are shifting toward a decreased delay, the memory sub-system controller can adjust the timing by removing a delay factor.

Advantages of the present disclosure include, but are not limited to, improved system performance by removing the need to perform multiple write training procedures during operation of the memory sub-system. Additionally, advantages of the present disclosure include a decrease in data loss potential by adjusting the timing parameters of the operations performed by a memory device based on the measured output variations of the memory devices' internal oscillator.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a voltage temp tracking component 113 that can track the effects of voltage and temperature on a memory device 130, 140 by comparing the outputs of an internal oscillator from one run cycle to the next. In some embodiments, the memory sub-system controller 115 includes at least a portion of the voltage temp tracking component 113. In some embodiments, the voltage temp tracking component 113 is part of the host system 120, an application, or an operating system. In other embodiments, local media controller 135 includes at least a portion of voltage temp tracking component 113 and is configured to perform the functionality described herein.

The voltage temp tracking component 113 can adjust the timing parameters for executing write operations on a memory device. Note that the voltage temp tracking component 113 can adjust the timing parameters for executing write operations on either volatile memory devices (e.g., memory device 140), and/or on non-volatile memory devices (e.g., memory device 130). While the examples described herein refer to volatile memory device 140, aspects of the present disclosure are equally applicable to non-volatile memory device 130.

At power-on and prior to operation of the memory sub-system, the memory sub-system controller can perform a variety of procedures to initialize and calibrate the memory device 140. One of these procedures includes write training, the result of which reflects the delay between when the memory device's internal clock signal is sent to data input pin, and when the signal is received by the input pin. The memory sub-system controller 115 can then apply the measured delay to the timing of operations performed on the memory device 140. Subsequently, during operation of the memory sub-system 110, the voltage temp tracking component 113 can, using the memory device's internal oscillator, further adjust the timing parameters for executing write operations on a memory device 140 by applying an offset to the timing delay.

The memory device 140 includes an oscillator that has one or more counters coupled to it. The oscillator receives the clock signal from memory sub-system controller 115. In embodiments, the oscillator generates clock signal based on replica clock circuitry of a clock operating on the memory sub-system 110. The oscillator has a corresponding run time (e.g., 20 microseconds), which can be referred to as a run cycle. That is, a run cycle represents a given time interval during which the oscillator is running. In embodiments, the voltage temp tracking component 113 can issue a command to start the oscillator, and a command to stop the oscillator. The time interval between the start and stop commands represents a run cycle. In embodiments, the oscillator has an associated run time, and, after receiving the start command, can automatically stop at the expiration of the associated run time. In some embodiments, the oscillator can run continuously, according to a predefined run time. In embodiments, the voltage temp tracking component 113 can issue the start command to start the oscillator run cycle on a predetermined schedule (e.g., every few minutes, or once an hour), and/or can issue the start command in response to a triggering event. A triggering event can be, for example, receiving a notification that the temperature of the memory sub-system 110 has satisfied criterion (e.g., has exceeded a high temperature threshold, or has fallen below a low temperature threshold), and/or receiving a notification that an error rate associated with a memory device 140 has exceeded a threshold value.

At the expiration of the run cycle, the values of the counters coupled to the oscillator are output to a register. The voltage temp tracking component 113 can retrieve the counter values, and can compare the counter values to previous counter values to determine whether the memory device 140 has experienced a shift due to a voltage or temperature drift. That is, if the output values of the counters from one run cycle to the next have not changed, the voltage temp tracking component 113 can determine that the memory device 140 to which the oscillator is coupled has not experienced adverse effects of the operating conditions (e.g., varying temperatures and/or supply voltages). Conversely, if the output values of the counters from one run cycle to the next have changed, the voltage temp tracking component 113 can determine that the memory device 140 to which the oscillator is coupled has experienced adverse effects of the operating conditions.

In one embodiment, the voltage temp tracking component 113 can use an XOR operation to compare the output values of the counters from one run cycle to the next. Hence, an XOR result of false indicates that the output values of the counters from one run cycle to the next are the same; conversely, an XOR result of true indicates that the output values are not the same. In embodiments, the voltage temp tracking component 113 can further compare the output values of the counters from one run cycle to the next to determine whether the difference between the values is significant enough to warrant adjusting the timing parameters. That is, the voltage temp tracking component 113 can subtract the output values from the current run cycle from the output values from the previous run cycle, and if the absolute value of the difference does not exceed a threshold value, the voltage temp tracking component 113 can determine that the affects experienced by the memory device 140 are relatively minor and not significant enough to warrant adjusting the timing parameters.

The voltage temp tracking component 113 can adjust the timing parameters for various operations based on the difference between the current output values and the output values from the previous run cycle. The voltage temp tracking component 113 can adjust the timing parameters by applying an offset to the timing delay. The offset is based on the difference between the measured delay at time T1 compared to the measured delay at time T2 (where T1 represents the run-cycle of the oscillator immediately preceding T2). The delay represents the time delay between the memory sub-system's clock and the memory device's internal replica clock circuitry The voltage temp tracking component 113 can determine the delay at time T1 by dividing the run-cycle (i.e., the oscillator run-time) by the counter output values at time T1. The voltage temp tracking component 113 can determine the delay at time T2 by dividing the run-cycle by the counter output values at time T2. The voltage temp tracking component 113 can determine the offset by comparing the delay at time T1 to the delay at time T2. The voltage temp tracking component 113 can subtract the delay at time T2 from the delay at time T1 to determine whether to increment or decrement the delay in the timing parameters. In embodiments, the voltage temp tracking component 113 can compare the delay at time T1 to the value of the memory sub-system's internal clock to determine whether to increment or decrement the delay in the timing parameters. That is, the adjustment circuit can be adjusted either clock-based or asynchronous-delay based. Further details with regards to the operations of the voltage temp tracking component 113 are described below.

Figure 2:
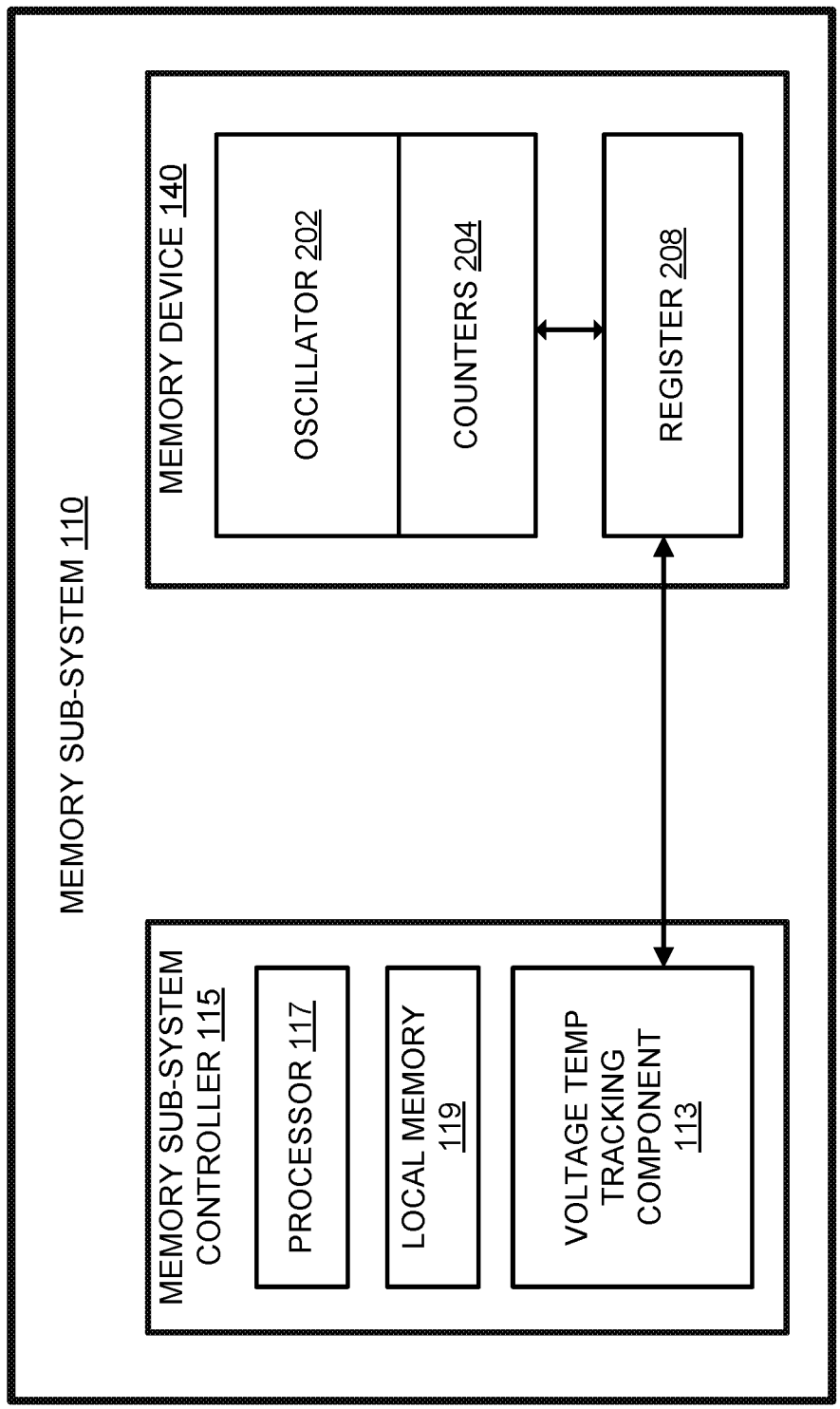
FIG. 2 illustrates an example memory sub-system in accordance with some embodiments of the present disclosure.

FIG. 2 illustrates an example memory sub-system 110 in accordance with some embodiments of the present disclosure. Memory device 140 can include an oscillator 202. For example, oscillator 202 can be a ring oscillator that oscillates between two voltage levels. In embodiments, memory sub-system controller 115 can initialize the oscillator 202 to replicate the clock of the memory sub-system 110. Counters 204 can include one or multiple counters coupled to oscillator 202. In embodiments, counters 204 can be a 4-bit counter, which has four outputs. Each output can stay high or low for twice as long as the previous output. Hence, with all the outputs starting low, it takes 16 clock pulses to return back to the same state. The oscillator 202 can emit a clock pulse that replicates the clock of the memory sub-system controller 115. The oscillator 202 can have a determined run time. In embodiments, the run time can be based on a separate set of counters (not pictured). At the expiration of the run time, the counters 204 can output a value to the register 208. Voltage temp tracking component 113 can access the register 208 to identify the counter output values from counters 204. Voltage temp tracking component 113 can then compare the output values from one run cycle to the next to determine whether the memory device 140, including oscillator 202, has been affected by the operating conditions. Since the run cycles have the same set length, if the memory device 140 has not been adversely affected by operating conditions, the output from counters 204 should remain the same from one run cycle to the next. Thus, if the counter outputs differ from one run cycle to the next, the voltage temp tracking component 113 can determine that the memory device 140 has been adversely affected by the operating conditions.

Figure 3:
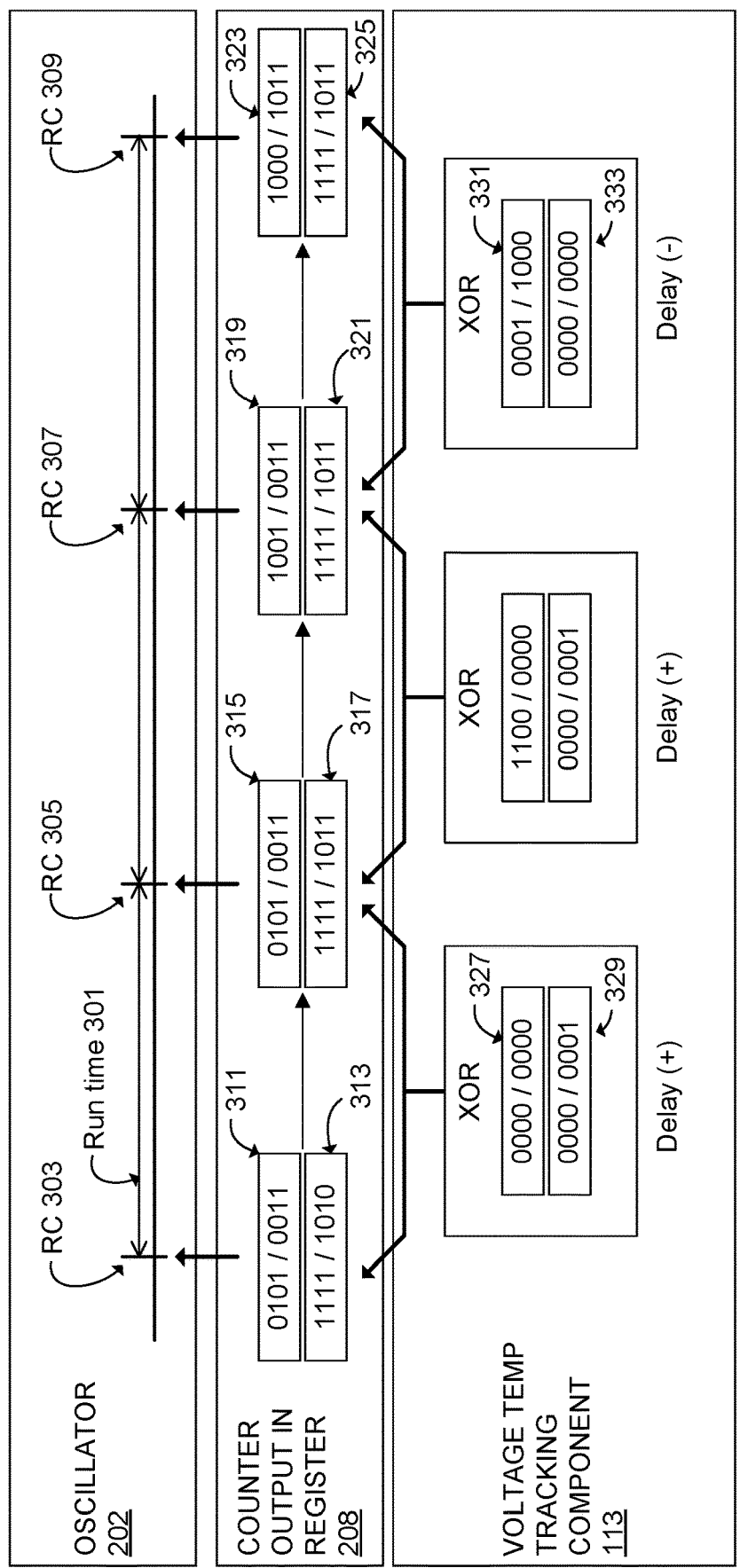
FIG. 3 illustrates an example implementation of the voltage temp tracking component, in accordance with some embodiments of the present disclosure.

FIG. 3 illustrates an example implementation of the voltage temp tracking component 113, in accordance with some embodiments of the present disclosure. FIG. 3 illustrates an example of how the oscillator 202, the counter output values in register 208, and the voltage temp tracking component 113 function. FIG. 3 illustrates an oscillator run time 301. In embodiments, the voltage temp tracking component 113 can send a start command to start a run cycle, and can send a stop command to stop the run cycle. In embodiments, the oscillator 202 can have an associated run time. For example, the run time can be stored in a mode register on the memory device. Once the oscillator 202 receives a start command, the oscillator 202 can automatically stop at the expiration of the associated run time. The expiration of run time 301 denotes a run cycle (RC 303, 305, 307, and 309). In embodiments, run cycles 303, 305, 307, 309 may not be continuous. That is, there may be a time period in between each run cycle 303, 305, 307, and 309. At the end of each run cycle, the memory device 140 stores the counter values in a mode register 208. In embodiments, the least significant bits (LSB) of the counter output values (311, 315, 319, 323) are stored in one mode register, and the most significant bits (MSB) of the counter output values (313, 317, 321, 325) are stored in another mode register. The voltage temp tracking component 113 can access the mode registers to identify the counter output values 311-325. The voltage temp tracking component 113 can compare the counter output values 311-325 by performing XOR operations on the counter values 311-325. In other embodiments, some other logical operation can be performed for the comparison.

The voltage temp tracking component 113 compares the LSB counter output values at a first time (e.g., at RC 303) to the LSB counter output values at a second time (e.g., RC 305). Similarly, the voltage temp tracking component 113 compares the MSB counter output values at a first time (e.g., RC 303) to the MSB counter output values at a second time (e.g., RC 305). As illustrated in FIG. 3, the LSB counter output values 311, 315 have not changed between run cycle 303 and run cycle 305, and hence the result of the XOR operation 327 is false. The MSB counter output values 313, 317 have changed between run cycle 303 and run cycle 305, and hence the result of the XOR operation 329 is true. Thus, the voltage temp tracking component 113 adjusts the time parameters for performing operations by the corresponding memory device 140. The voltage temp tracking component 113 can compare the output values to determine whether to increase or decrease the delay in the timing parameters. A higher counter value represents an increase in PVT. At increased PVT, signals can be transmitted faster, and hence the voltage temp tracking component 113 can provide an offset that decreases the timing delay. A lower counter value represents a decrease in PVT. At decreased PVT, signals can be transmitted slower, and hence the voltage temp tracking component 113 can provide an offset that increases the timing delay. Thus, the difference between the counter output values indicates an increased delay. That is, the difference between output values at RC 303 compared to the output values at RC 305 indicates that the timing signal is speeding up, and thus the propagation delay is to be decreased.

Similarly, the XOR result between run cycle 305 and 307 indicates an increased delay, and thus the propagation delay is decreased. The XOR result (331, 333) between run cycle 307 and 309 is true, and thus the voltage temp tracking component 113 determines whether to increase or decrease the delay in the timing parameters. Since the difference between the counter values at RC 309 and the counter values at RC 307 indicates that the oscillator timing is slowing down, after run cycle 309, the voltage temp tracking component 113 increases the propagation delay.

To adjust the timing parameters, the voltage temp tracking component 113 can determine the delay at the end of each RC 303-309 by dividing the run-time length (e.g., 5 ns) by the counter value output. The voltage temp tracking component 113 can then compare the delay from one RC (e.g., RC 309) to the delay from the previous RC (e.g., RC 307) to determine the propagation delay offset to apply. The offset can be clock-based, or asynchronous delay based. Adjusting the timing parameters can add or subtract a timing value to the propagation delay for the charge to be transferred to the memory cell.

In embodiments, the voltage temp tracking component 113 can increase the run time length 301 to reduce the quantization error associated with the oscillator. That is, the oscillator granularity error is directly proportional to the run-time of the oscillator, and hence the voltage temp tracking component 113 can increase the accuracy of the oscillator by increasing the run-time 301.

Figure 4:
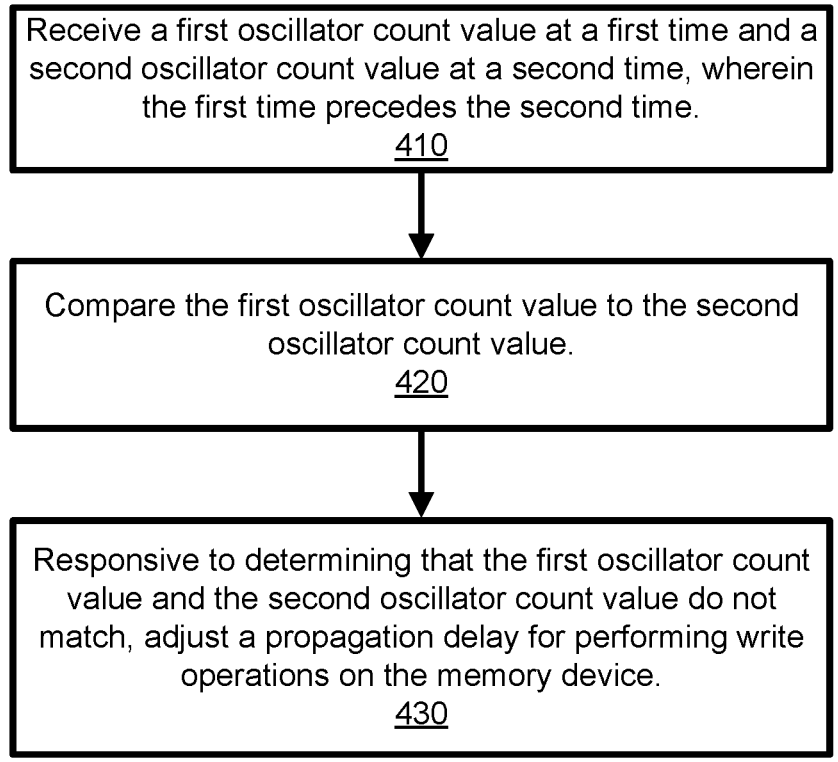
FIG. 4 is a flow diagram of an example method to adjust the propagation delay for performing write operations on a memory device using oscillator count values, in accordance with some embodiments of the present disclosure.

FIG. 4 is a flow diagram of an example method 400 to adjust the propagation delay for performing write operations on a memory device using oscillator count values, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the voltage temp tracking component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a first oscillator count value at a first time, and a second oscillator count value at a second time. The first time precedes the second time. The first time can represent the end of a first run cycle of the oscillator, and the second time can represent the end of a second run cycle of the oscillator. In embodiments, the first run cycle immediately precedes the second run cycle. That is, the first run cycle and the second run cycle are consecutive run cycles. The first oscillator count value represents a first output of a ring oscillator, such as ring oscillator 202 of memory device 140, at the first time, and the second oscillator count value represents a second output of the ring oscillator at the second time. For example, the first oscillator count value can be counter outputs 319, 321, and the second oscillator count value can be counter outputs 323, 325 as illustrated in FIG. 3. The ring oscillator 202 is associated with the memory device 140 and can include one or more counters, such as counters 204. That is, the ring oscillator 202 can be included in the memory device 140, and the counters 204 are coupled to the ring oscillator 202. The count values of each counter coupled with the ring oscillator 202 represent the output of the ring oscillator 202.

In embodiments, each oscillator count value can include a set of least significant bits of the output of the ring oscillator 202 associated with the memory device 140, and a set of most significant bits on the output of the ring oscillator 202 associated with the memory 140. The memory device 140 can store the least significant bits of the oscillator count value in a first mode register of the memory device 140, and the most significant bits of the oscillator count value in a second mode register of the memory device 140.

At operation 420, the processing logic compares the first oscillator count value (e.g., 319, 321) to the second oscillator count value (e.g., 323, 325). In one embodiment, to compare the two count values, the processing logic performs an exclusive OR (XOR) operation on the first oscillator count value and the second oscillator count value. The processing logic compares each corresponding bit in the first and second oscillator count values. If each corresponding bit matches, the result of the XOR operation is false (e.g., illustrated as XOR result 333); conversely, if one (or more) bits do not match, the result of the XOR operation is true (e.g., illustrated as XOR result 331).

At operation 430, responsive to determining that the first oscillator count value and the second oscillator count value do not match, the processing logic adjusts a propagation delay for performing write operations on the memory device. That is, responsive to determining that the result of the XOR operation is true, the processing logic can determine to either increase or decrease the propagation delay for performing write operations on the memory device.

To determine whether to increase or decrease the propagation delay, the processing logic can compute a timing delay based on the difference between the second oscillator count value and the first oscillator count value. An increase in the oscillator count value represents an increase in PVT, and thus an increase in the speed of signal transmission. Thus, an increase in oscillator count value results in a decrease in propagation delay to make up for the increase in speed of signal transmission. Conversely, a decrease in the oscillator count value represents a decrease in PVT, and thus a decrease in the speed of signal transmission. Thus, a decrease in oscillator count value results in an increase in propagation delay, to account for the decrease in the speed of signal transmission. In embodiments, the processing logic can subtract the first oscillator count value from the second oscillator count value. A first oscillator count value that is greater than the second oscillator count value can indicate that the oscillator has slowed down. Hence, if the first oscillator count value is greater than the second oscillator count value, the processing logic can increase the propagation delay. Conversely, a first oscillator counter value that is less than the second oscillator count value indicates that the oscillator has sped up. Thus, if the first oscillator count value is less than the second oscillator count value, the processing logic can decrease the propagation delay.

In embodiments, the processing logic can adjust the propagation delay for performing write operations responsive to determining that the difference between the first oscillator count value and the second oscillator count value satisfies a criterion. To satisfy the criterion, the absolute value of the difference between the first oscillator count value and the second oscillator count value exceeds a threshold value. That is, prior to adjusting the propagation delay, the processing logic can determine that the variation experienced by the oscillator exceeds the threshold value. In some instances, the variation experienced by the oscillator is not enough to warrant an adjustment to the propagation delay. That is, the likelihood of an error corresponding to the variation experienced by the oscillator is within the acceptable granularity level. In embodiments, the processing logic can reduce the acceptable granularity level by increasing the run-time of the oscillator.

FIG. 5 is a flow diagram of an example method 500 to adjust the timing of a write operation based on a difference between oscillator count values, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the voltage temp tracking component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic identifies a first oscillator count value representing a first output of a ring oscillator at a first time, and a second oscillator count value representing a second output of the ring oscillator at a second time. The ring oscillator is associated with a memory device, such as ring oscillator 202 of memory device 140, as illustrated in FIG. 2. The first time period precedes the second time period. The first time can represent the end of a first run cycle of the oscillator, and the second time can represent the end of a second run cycle of the oscillator. In embodiments, the first run cycle immediately precedes the second run cycle. That is, the first run cycle and the second run cycle are consecutive run cycles.

One or more counters 204 are coupled to the ring oscillator 202. The count values of each counter coupled with the ring oscillator 202 form the output of the ring oscillator 202. In an example, the first oscillator count value can be counter outputs 319, 321, and the second oscillator count value can be counter outputs 323, 325 as illustrated in FIG. 3.

In embodiments, each oscillator count value can include a set of least significant bits of the output of the ring oscillator 202 associated with the memory device 140, and a set of most significant bits on the output of the ring oscillator 202 associated with the memory 140. The memory device 140 can store the least significant bits of the oscillator count value in a first mode register of the memory device 140, and the most significant bits of the oscillator count value in a second mode register of the memory device 140. The processing logic can identify the counter values by accessing the more registers of the memory device 140.

At operation 520, the processing logic compares the first oscillator count value (e.g., 311, 313) and the second oscillator count value (e.g., 315, 317). In embodiments, to compare the two count values, the processing logic performs an exclusive OR (XOR) operation on the first oscillator count value and the second oscillator count value. The processing logic compares each corresponding bit in the first and second oscillator count values. If each corresponding bit matches, the result of the XOR operation is false (e.g., illustrated as XOR result 327); conversely, if one (or more) bits do not match, the result of the XOR operation is true (e.g., illustrated as XOR result 329).

At operation 530, the processing logic performs a write operation on a memory device. The processing logic adjusts the timing of the write operation based on the difference between the first oscillator count value and the second oscillator count value. If the result of the XOR operation is false (i.e., the first oscillator count value and the second oscillator count value match), the processing logic can perform the write operation on the memory device without adjusting the timing of the write operation. However, if the result of the XOR operation is true, the processing logic can determine which oscillator count value is greater. If the second oscillator count value is greater than the first oscillator count value, the processing logic can adjust the timing of the write operation by decreasing a timing parameter for performing the write operation (e.g., by decreasing the propagation delay). Conversely, if the second oscillator count value is less than the first oscillator count value, the processing logic can adjust the timing of the write operation by increasing the timing parameter for performing the write operation (e.g., by increasing the propagation delay). The size of the adjustment to the write parameter can be based on the difference between the first oscillator count value and the second oscillator count value. For example, the processing logic can determine a delay time period for each of the first time and the second time by dividing the run-time length by the corresponding oscillator count value. The processing logic can then compare the delay time periods to determine by how much to adjust the timing of the write operation. For example, if the delay time period at the first time is one clock cycle less than the delay time period at the second time period, the processing logic can adjust the timing parameters by adding a clock cycle delay.

In embodiments, the processing logic can adjust the timing of the write operation responsive to determining that the difference between the first oscillator count value and the second oscillator count value satisfies a criterion. To satisfy the criterion, the absolute value of the difference between the first oscillator count value and the second oscillator count value exceeds a threshold value. That is, prior to adjusting the timing parameter, the processing logic can determine that the variation experienced by the oscillator exceeds the threshold value. In some instances, the variation experienced by the oscillator is not enough to warrant an adjustment to the propagation delay. That is, the likelihood of an error corresponding to the variation experienced by the oscillator is within the acceptable granularity level.

Figure 6:
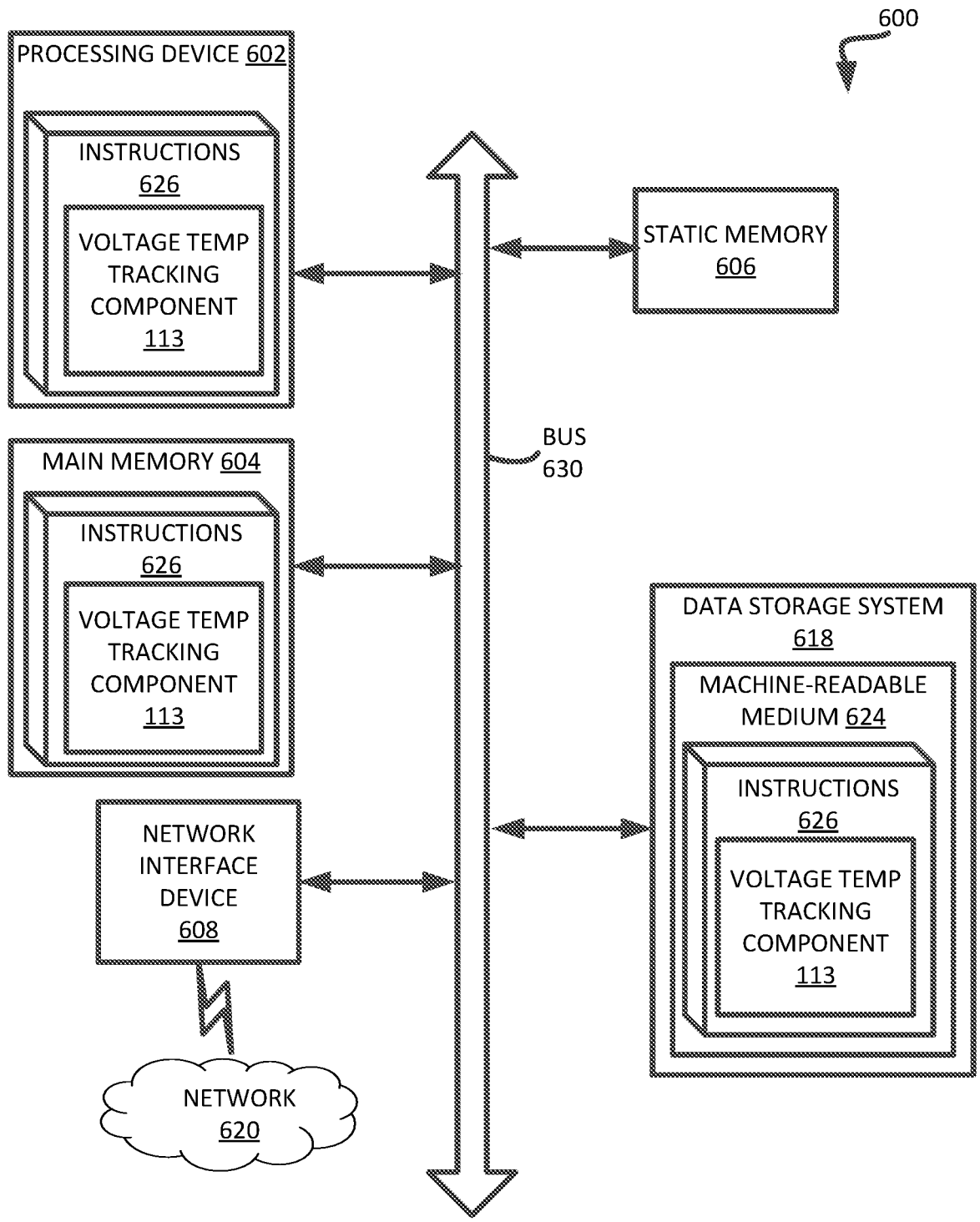
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage temp tracking component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a voltage temp tracking component (e.g., the voltage temp tracking component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
receiving a first oscillator count value at a first time and a second oscillator count value at a second time, wherein the first time precedes the second time;
comparing the first oscillator count value to the second oscillator count value; and
responsive to determining that a difference between the first oscillator count value and the second oscillator count value satisfies a criterion, adjusting a propagation delay for performing write operations on the memory device.

2. The system of claim 1, wherein the first oscillator count value represents a first output of a ring oscillator at the first time, wherein the ring oscillator is associated with the memory device and comprises one or more counters; and wherein the second oscillator count value represents a second output of the ring oscillator at the second time.

3. The system of claim 1, wherein comparing the first oscillator count value to the second oscillator count value comprises:
performing an exclusive OR operation on the first oscillator count value and the second oscillator count value; and
responsive to determining that a result of the exclusive OR operation is false, determining that the first oscillator count value and the second oscillator count value match.

4. The system of claim 1, wherein adjusting the propagation delay comprises:
decreasing the propagation delay responsive to determining that the second oscillator count value is greater than the first oscillator count value.

5. The system of claim 1, wherein adjusting the propagation delay comprises:
increasing the propagation delay responsive to determining that the second oscillator count value is less than the first oscillator count value.

6. The system of claim 1, wherein the first oscillator count value and the second oscillator count value each comprise a set of least significant bits of an output of a ring oscillator associated with the memory device and a set of most significant bits of the output of the ring oscillator associated with the memory device.

7. A method comprising:
identifying a first oscillator count value representing a first output of a ring oscillator at a first time, and a second oscillator count value representing a second output of the ring oscillator at a second time, wherein the first time precedes the second time;
comparing the first oscillator count value and the second oscillator count value; and
responsive to determining that a difference between the first oscillator count value and the second oscillator count value satisfies a criterion, performing a write operation on a memory device, wherein a timing of the write operation is adjusted based on the difference between the first oscillator count value and the second oscillator count value.

8. The method of claim 7, wherein the ring oscillator is associated with the memory device, and wherein the ring oscillator comprises one or more counters.

9. The method of claim 7, wherein the first oscillator count value and the second oscillator count value each comprise a set of least significant bits of an output of the ring oscillator associated with the memory device and a set of most significant bits of the output of the ring oscillator associated with the memory device.

10. The method of claim 7, wherein comparing the first oscillator count value to the second oscillator count value comprises:
performing an exclusive OR operation on the first oscillator count value and the second oscillator count value; and
responsive to determining that a result of the exclusive OR operation is false, determining that the first oscillator count value and the second oscillator count value match.

11. The method of claim 7, wherein adjusting the timing of the write operation comprises:
responsive to determining that the second oscillator count value is greater than the first oscillator count value, adjusting the timing of the write operation by decreasing a timing parameter for performing the write operation on the memory device; and
responsive to determining that the second oscillator count value is less than the first oscillator count value, adjusting the timing of the write operation by increasing the timing parameter for performing the write operation on the memory device.

12. A non-transitory computer-readable storage medium comprising instructions that, when executed by a processing device, cause the processing device to perform operations comprising:
receiving a first oscillator count value at a first time and a second oscillator count value at a second time, wherein the first time precedes the second time;
comparing the first oscillator count value to the second oscillator count value; and
responsive to determining that a difference between the first oscillator count value and the second oscillator count value satisfies a criterion, adjusting a propagation delay for performing write operations on a memory device.

13. The non-transitory computer-readable storage medium of claim 12, wherein the first oscillator count value represents a first output of a ring oscillator at the first time, wherein the ring oscillator is associated with the memory device and comprises one or more counters; and wherein the second oscillator count value represents a second output of the ring oscillator at the second time.

14. The non-transitory computer-readable storage medium of claim 12, wherein comparing the first oscillator count value to the second oscillator count value comprises:
performing an exclusive OR operation on the first oscillator count value and the second oscillator count value; and
responsive to determining that a result of the exclusive OR operation is false, determining that the first oscillator count value and the second oscillator count value match.

15. The non-transitory computer-readable storage medium of claim 12, wherein adjusting the propagation delay comprises:
    decreasing the propagation delay responsive to determining that the second oscillator count value is greater than the first oscillator count value.

16. The non-transitory computer-readable storage medium of claim 12, wherein adjusting the propagation delay comprises:
    increasing the propagation delay responsive to determining that the second oscillator count value is less than the first oscillator count value.

17. The non-transitory computer-readable storage medium of claim 12, wherein the first oscillator count value and the second oscillator count value each comprise a set of least significant bits of an output of a ring oscillator associated with the memory device and a set of most significant bits of the output of the ring oscillator associated with the memory device.

\* \* \* \* \*